United States Patent [19]
Mandai et al.

[11] Patent Number: 5,763,903
[45] Date of Patent: Jun. 9, 1998

[54] AVALANCHE PHOTODIODE FOR LIGHT DETECTION

[75] Inventors: Masaaki Mandai; Tomoyuki Yoshino; Tadao Akamine; Yutaka Saitoh; Junko Yamanaka; Osamu Koseki, all of Chiba, Japan

[73] Assignee: Seiko Instruments Inc., Japan

[21] Appl. No.: 516,234

[22] Filed: Aug. 17, 1995

[30] Foreign Application Priority Data

| Aug. 17, 1994 | [JP] | Japan | 6-193414 |
| Aug. 18, 1994 | [JP] | Japan | 6-194417 |
| Aug. 9, 1995 | [JP] | Japan | 7-203061 |

[51] Int. Cl.⁶ ............................................. H01L 31/0328
[52] U.S. Cl. .................. 257/186; 257/438; 257/460; 257/619; 257/686
[58] Field of Search ........................ 257/186, 603, 257/605, 606, 619, 686, 461, 777, 438, 460

[56] References Cited

U.S. PATENT DOCUMENTS 5,021,854   6/1991   Huth .............................. 357/30

FOREIGN PATENT DOCUMENTS

| 616373 | 9/1994 | European Pat. Off. . |
| 2284989 | 4/1976 | France . |
| 1441261 | 6/1976 | United Kingdom . |

OTHER PUBLICATIONS

Patent Abstracts of Japan, vol. 15, No. 323 (E–1101) 16 Aug. 1991, Mayumi (03–120,875).
Patent Abstracts of Japan, vol. 14, No. 210 (E–0922) 27 Apr. 1990, Juri (2–046,770).
Patent Abstracts of Japan, vol. 14, No. 16 (E–872) 12 Jan. 1989, Yoshihiro (1–259,539).
Patent Abstracts of Japan, vol. 4, No. 44 (E–005) 5 Apr. 1980, Yoshiyuki (55–013,963).

*Primary Examiner*—Minh-Loan Tran
*Attorney, Agent, or Firm*—Adams & Wilks

[57] ABSTRACT

An avalanche photodiode for detecting x-rays and other radiation comprises a first substrate having a portion removed therefrom, a first insulating film formed on the first substrate, a second substrate comprising a floating zone silicon semiconductor substrate disposed on the first insulating film, an impurity region selectively formed in the second substrate at a surface corresponding to the removed portion, a PN junction formed on the second substrate, a glass substrate mounted to the second substrate, a first electrode formed on the first substrate for applying a voltage to the impurity region, a second electrode formed on the second substrate for applying a voltage to the second substrate, a third electrode formed on the glass substrate and electrically connected to the second electrode, and an integrated circuit package having a lead pin connected to the third electrode. Accordingly, a shallow depletion layer may be provided on a floating zone SOI substrate. The substrates may be joined to the glass substrate using a eutectic bonding process.

21 Claims, 16 Drawing Sheets

- 3a ELECTRODE
- 1 FIRST SUBSTRATE
- 2 SECOND SUBSTRATE
- 11 ELECTRODE
- 4 GLASS SUBSTRATE
- 8 IC PACKAGE
- 10 LEAD PIN

SILICON DIAPHRAGM

6 THROUGH HOLE

PROJECTION 108

5,763,903

AVALANCHE PHOTODIODE FOR LIGHT DETECTION

BACKGROUND OF THE INVENTION

The present invention relates to an avalanche photodiode that can be used for light detection, X-ray detection and electron beam detection or the like, and to a method for fabricating the same.

Heretofore, avalanche photodiodes use a semiconductor substrate on which an epitaxial π layer 21 is provided which is formed by epitaxially growing silicon on a FZ substrate 20 as shown in FIG. 20. Further, as shown in FIG. 22, a thickness d which comprises part of a FZ substrate may be set to several tens of μm for usage. Such a semiconductor substrate is directly joined with an IC package as shown in FIGS. 21 and 23, and electrodes 3a and 3b are bonded to a lead pin 10 of the IC package with a metal wire 15 to provide an electric conduction.

The conventional avalanche photodiode assumes the above-mentioned semiconductor substrate structure, but the following points can be raised as problems that should be solved.

When an FZ epitaxial substrate structure is adopted, there is a problem in that firstly an oxygen content in the substrate is small, so the physical strength of the substrate is weak, so that deformation (warp in a wafer) is generated in the substrate under heat treatment in the fabrication step, and dislocation slip increases, which makes it difficult to continue the subsequent processes and which deteriorates the device characteristics thus fabricated.

Further, secondly, when X-ray radiation or the like is detected with the avalanche photodiode, a P$^+$-layer comprising a FZ substrate 20 shown in FIG. 20 constitutes a incident light scattering area so that the width of the area should be as short as possible. To reduce the contact resistance with the electrode 22, the width, at least several μm is required for the layer. In addition to a current generated in the depletion layer when the X-ray is incident, there also exists a current which is generated by the delayed depletion of carriers generated in this area to the depletion layer. Thus there is a problem in that the time resolution of the avalanche photodiode decreases.

When a FZ substrate having a thickness of about tens of μm is used and the thickness of the P$^+$-layer 20 shown in FIG. 22 is thin, the above-mentioned problem of the time resolution can be avoided. However, since the substrate is thin, the physical strength thereof is weaker than the normal FZ substrate. The result is that problems become more serious as seen in the reduction in the fabrication yield ratio resulting from an increase in the warp of the wafer caused by heat treatment process and a dislocation slip and a reduction in the device performance such as an increase in the reverse bias leak current.

When the P$^+$-layer 20 is formed after part of the FZ substrate 27 is etched or polished to be thinned down to a thickness of tens of Am like the conventional example shown in FIG. 22, the above-mentioned problems of the mechanical strength and the time resolution are improved. However, it is difficult to control with a good precision the thickness d of the remaining silicon wafer with the result that the planarity and the crystallinity of the silicon surface 23 are far from the counterparts of the original wafer surface. When the silicon is dry etched, the silicon surface becomes extremely rough and crystal defects caused by the damage at the time of etching are introduced. When the silicon is wet etched, an etch pit or the like is likely to be generated. Consequently, the performance of the device formed therein is deteriorated.

Examples in which the above-mentioned avalanche photodiode is packaged are shown in FIGS. 21 and 23. The physical strength of the avalanche photodiode is weak even when the diode is directly packaged in the IC package. Thus there arises a problem in that the diode is sometimes broken when the diode is wire-bonded, the substrate is deformed (a warp in the wafer), and the device characteristics of the fabricated device are deteriorated. Additionally, when the diode is used in the atmosphere of a high temperature, the influence of heat to the avalanche photodiode by heat accumulation of the IC package largely deteriorates the characteristics of the avalanche photodiode.

SUMMARY OF THE INVENTION

An object of the invention is to provide and X-ray detecting device having a good detection sensitivity and a good time resolution.

Means adopted in one aspect of the present invention to attain the above-mentioned object are characterized by comprising:

a first insulating film formed on a first substrate;

a second substrate comprising a silicon semiconductor substrate (FZ substrate) which is crystal grown on said insulating film;

a PN-junction formed on said second substrate;

electrodes for applying a voltage to said PN-junction which are formed on said second substrate by sandwiching a second insulating film therebetween;

wherein said first substrate is joined with a glass substrate, the surface of the glass substrate which is not joined with the first substrate is joined with an IC package, and said electrodes are electrically connected with a lead pin of the IC package.

Further, another aspect the present invention is characterized by comprising:

a PN-junction formed on the second substrate;

electrodes for applying a voltage to said PN-junction which are formed on the surface of the second substrate by sandwiching a second insulating film;

wherein the surface of the second substrate on which electrodes are formed is joined with the surface of a glass substrate on which an electrode is formed, the electrodes and an electrode on the glass substrate are electrically connected to each other, the surface of the glass substrate surface opposite to the surface where the electrode is formed is joined with an IC package, and the electrode formed on a glass substrate is electrically connected to the lead pin of the IC package.

Further, the present invention provides a method for fabricating an avalanche photodiode, the method comprising the steps of:

processing a glass cover for protecting the surface of a FZ substrate;

etching with an alkaline agent a portion of a CZ substrate where a silicon nitride film of the CZ substrate is removed followed by suspending the progress of etching with a silicon oxide film in an SOI substrate to form a diaphragm;

dicing a thin part of the glass cover to a depth such that the glass cover is not penetrated from the side of the glass cover;

dicing a part located at a relative position with a dicing line processed on a dicing line from the side of the CZ substrate to a depth such that the CZ substrate is not penetrated; and bending the glass cover and the SOI substrate to remove the glass cover.

Further, the method according to the present invention comprises:

forming a metal thin film on a side of a glass substrate and coating a photoresist to pattern the metal thin film;

etching a glass substrate with a fluorine agent;

removing a metal thin film and a photoresist used as a mask;

patterning a photoresist on the surface of the glass substrate;

etching the metal thin film in accordance with the patterned photoresist;

etching the glass substrate with the fluorine agent;

removing the metal thin film and the photoresist;

forming the metal thin film on the surface of the glass substrate that has been etched and processed followed by patterning the metal thin film;

positioning and joining by contacting each other an electrode on the FZ substrate of the SOI substrate with an electrode formed on a glass substrate for forming a junction.

In an avalanche photodiode thus constructed, the physical strength is strong even when the FZ substrate is thinned down, and at the same time, the scattering area of the incident light can be thinned down. Further, a deformation of the substrate during heat treatment (warp in the wafer) and the generation of the dislocation slip are reduced. Further, in a structure in which part of the first substrate is removed, electron beams or the like can be incident on this part. Further, when the avalanche photodiode is packaged in an IC package, since the substrate on which a PN junction is formed is not directly joined with the IC package, the result is that the photodiode is not affected by the heat accumulated in the IC package resulting from a rise in the peripheral temperature.

Further, in a method for fabricating an avalanche photodiode, since a step of forming a glass cover having a depression is included for protecting an element of the surface of a silicon substrate, the surface of the element is no longer etched with an alkaline agent. Further, an electrode is preliminarily formed on the glass substrate, and the electrode on the glass substrate and the electrode of the avalanche photodiode are positioned so as to contact each other, followed by joining the glass substrate and the SOI substrate with the result that a reverse bias can be applied to the PN junction which is formed on the FZ substrate by applying a voltage to an electrode on the glass substrate.

These and other objects, advantages, features, and uses will become more apparent as the description proceeds, when considered with the accompanying drawing

BRIEF DESCRIPTION OF THE DRAWING

In order to more fully understand the drawings used in the detailed description of the present invention, a brief description of each drawing is provided.

DESCRIPTION OF THE PREFERED EMBODIMENTS

Embodiments of the present invention will be explained hereinafter on the basis of the drawings.

Figure 1:
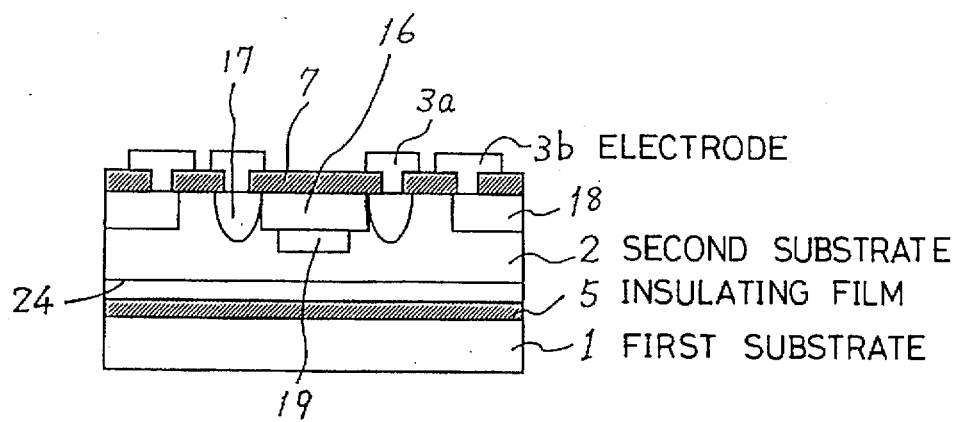
FIG. 1 is a schematic sectional view showing an avalanche photodiode according to one embodiment of the present invention.

FIG. 1 is schematic sectional view of an avalanche photodiode according to a first embodiment of the present invention. For example, between a first substrate (hereinafter referred to as a substrate 1) comprising silicon and a second substrate 2 (hereinafter referred to as a FZ substrate 2) comprising a P-type silicon having a specific resistance of 50 Ω·cm or more, an insulating film 5 comprising $SiO_2$ which is formed by thermal oxidation or CVD is formed. On the surface of the FZ substrate 2 on the opposite side of the substrate 1, for example, an N-type layer 16 doped with arsenic or phosphorus, and an N-type layer 17 contacting and surrounding the N-type layer 16 and doped with, for example, phosphorus, and a $P^+$-type layer 18 doped with, for example, boron also surrounding the N-type layer 16 without contacting the N-type layer 17 are formed. Beneath the N-type layer 16, a $P^\pm$-layer 19 is formed in contact with the N-type layer 16. On the upper surface of the FZ substrate 2, an insulating film 7 comprising $SiO_2$ formed by, for example, thermal oxidation is formed. On the surface of the FZ substrate 2 on the side of the substrate 1, a $P^+$-type layer 24 doped with, for example, boron is formed. On the insulating film 7, electrodes 3a and 3b, which are electrodes of the N-type layer 17 and the $P^+$-type layer 18, are formed.

Since the substrate 1 has the effect of reinforcing the FZ substrate 2 in the fabrication step thereof, a silicon CZ or FZ substrate 1 having the same thermal expansion coefficient as the FZ substrate 2 is desirable. Considering the high temperature treatment process in a high temperature fabrication step, a silicon CZ substrate which has crystal grown by the Czochralski Method and which endures heat treatment is the most desirable. Further, the FZ substrate needs a thickness of at least 100 μm or desirably 200 μm or more.

When the structure of the embodiment of the invention is adopted in the avalanche photodiode, the specific resistance of the FZ substrate can be set to several kΩ-cm or more that cannot be obtained in the epitaxial layer. Further, with the structure of the embodiment of the invention, the $P^+$-type layer 24 can easily be formed to a thickness of 1 μm or less as compared with a case of using an epitaxial layer wherein the thickness of the $P^+$-type layer cannot be thinned down to several μm or less even by polishing. This improves the time resolution of the avalanche photodiode.

When the thickness of the FZ substrate in the conventional avalanche photodiode is 100 μm or less, the deterioration problem occurs in device characteristics such as a reduction in the fabrication yield ratio and an increase in reverse bias leak current due to cracks of the substrate and an increase in the dislocation slips in thermal treatment and other fabrication steps. Further, when the FZ substrate has a thickness of 10 μm or less, the efficiency of X-ray detection is not practical. Consequently, the effect of the present embodiment is large when the FZ substrate has a thickness of from 10 μm to 100 μm.

Figure 2:
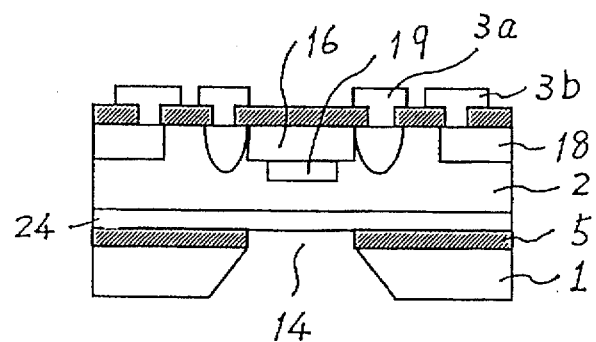
FIG. 2 is a schematic sectional view showing the avalanche photodiode according to one embodiment of the present invention.

FIG. 2 is a schematic sectional view of an avalanche photodiode according to a second embodiment of the present invention. In the second embodiment, part of the substrate 1 in the first embodiment is removed, and a substrate opening 14 is provided. At least in a part of a portion immediately beneath the PN-junction located at a position where the N-type layer 16 and the $P^\pm$-type layer 19 in the FZ substrate 1 contact each other, the opening 14 is provided. In the opening 14, the insulating film 5 is removed, too. The other aspect of the second embodiment is the same as the first embodiment.

When a radiation or the like is allowed to be incident from the opening 14 or when the avalanche photodiodes in the second embodiment are stacked, the insulating film 5 is desirably removed as shown in FIG. 2. When visible rays or the like are permitted to be incident from the opening 14, the insulating film 5 may be present without any problem when the insulating film 5 is formed of an oxide film having a thickness of 150 nm or less. Further, when electron beams, light or the like are allowed to be incident from the opening 14, it is more desirable that the opening 14 is smaller than p-type layer 19 as the amplification area. Because the non-uniformity in the amplification rate depending on the incident position can be small.

In the case where the radiation or the like is allowed to be incident from the side of the N-type layer 16, the amplification rate becomes non-uniform or lowered when the depth to which the incident radiation or the like is allowed to infiltrate into silicon is located in the vicinity of the $P^\pm$-type layer 19 which constitutes an amplification area. However, when the avalanche photodiode of the second embodiment is used to allow such radiation to be incident from the opening 14, such a problem is not generated. Consequently, in the second embodiment, when the radiation or the like is allowed to be incident from the opening 14, more favorable characteristics can be obtained. Further, it is more significant to improve the detection efficiency by forming the P-type layer 19 to 1 μm or less.

In the second embodiment, when a silicon surface direction (100) substrate is used as the substrate 1, a large stress concentrated on the edge of the opening 14 can be alleviated because the opening 14 intersects at an obtuse angle with a wall part in the (111) direction where the substrate 1 is removed by anisotropic etching using a potassium hydroxide solution.

Figure 3:
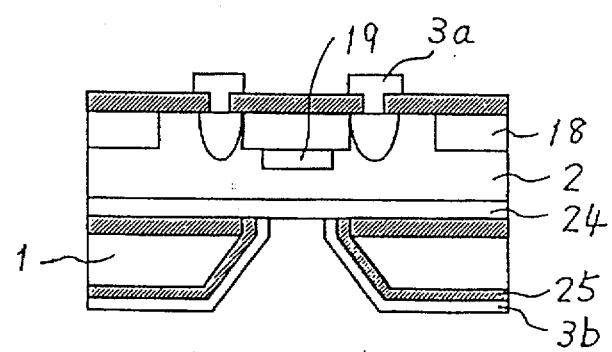
FIG. 3 is a schematic sectional view showing the avalanche photodiode according to one embodiment of the present invention.

FIG. 3 is a schematic sectional view showing the avalanche photodiode according to a third embodiment of the present invention. The electrode 3b, contacts the $P^+$-type layer 18 in the above-mentioned second embodiment. But in the third embodiment, this is formed so that the electrode 3b contacts the $P^+$-layer 24 of the FZ substrate 2 on the side of the substrate 1. Further, between the electrode 3b and the substrate 1, an insulating film 25 comprising an oxide film is formed. When electron beams, light or the like are allowed to be incident from the opening 14, the photodiode having the opening smaller than the P-type layer 19 which constitutes an amplification area is desirable because the non-uniformity in the amplification rate becomes small depending on the incident position as described in connection with the second embodiment. In the third embodiment, since the size and shape of the opening 14 can be determined according to the electrode 3b having one percent thickness compared with that of more than 100 μm of the substrate 1, the precision of the shape can be increased and the manufacturing size thereof can be made to smaller with the size of margin. The other aspect of the third embodiment is the same as the first embodiment.

By adopting the structure of the third embodiment, the series resistance between electrodes can be reduced.

Therefore, an avalanche photodiode having an excellent time resolution of a signal can be obtained.

Figure 4:
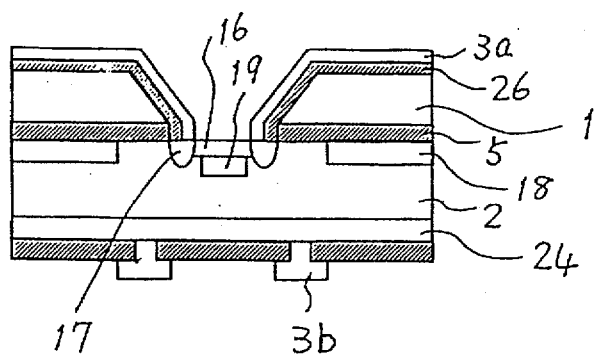
FIG. 4 is a schematic sectional view showing the avalanche photodiode according to one embodiment of the present invention.

FIG. 4 is a schematic sectional view of the avalanche photodiode according to a fourth embodiment of the present invention. An insulating film 5 is formed between the substrate 1 and the FZ substrate 2. On the surface of the FZ substrate 2 on the side of the substrate 1, for example, an N-type layer 16 doped with arsenic or phosphorus, an N-type layer 17 doped with for example phosphorous contacting and surrounding, the N-type layer 16 and a P-type layer 18 doped with, for example, boron and surrounding the N-type layer 17 without contacting the N-type layer 17 are formed. On the lower part of the N-type layer 16, a P$^\pm$-type layer 19 doped with boron is formed in contact with the N-type layer 16. On the surface of the FZ substrate 2 opposite side of the substrate 1, a P$^+$-type layer 24 doped with, for example, boron and an electrode 3b thereof are formed. Further, between the electrode 3a and the substrate 1, an insulating film 26 comprising an oxide film is formed.

The third embodiment has a structure in which the FZ substrate 2 of the second embodiment is turned up side down with respect to the substrate 1. While the radiation or the like is preferably allowed to be incident from the side of the P$^+$-type layer 24 located opposite to the P$^\pm$-type layer 19 which constitutes the amplification area for the measurement of a radiation or the like having a relatively small infiltration depth into the silicon, providing the P$^+$-type layer 24 at a remote position from the substrate 1 as this embodiment measurement of the P-type layer close to the radiation source or the like because the FZ substrate 2 is absent on the incident side.

Figure 5:
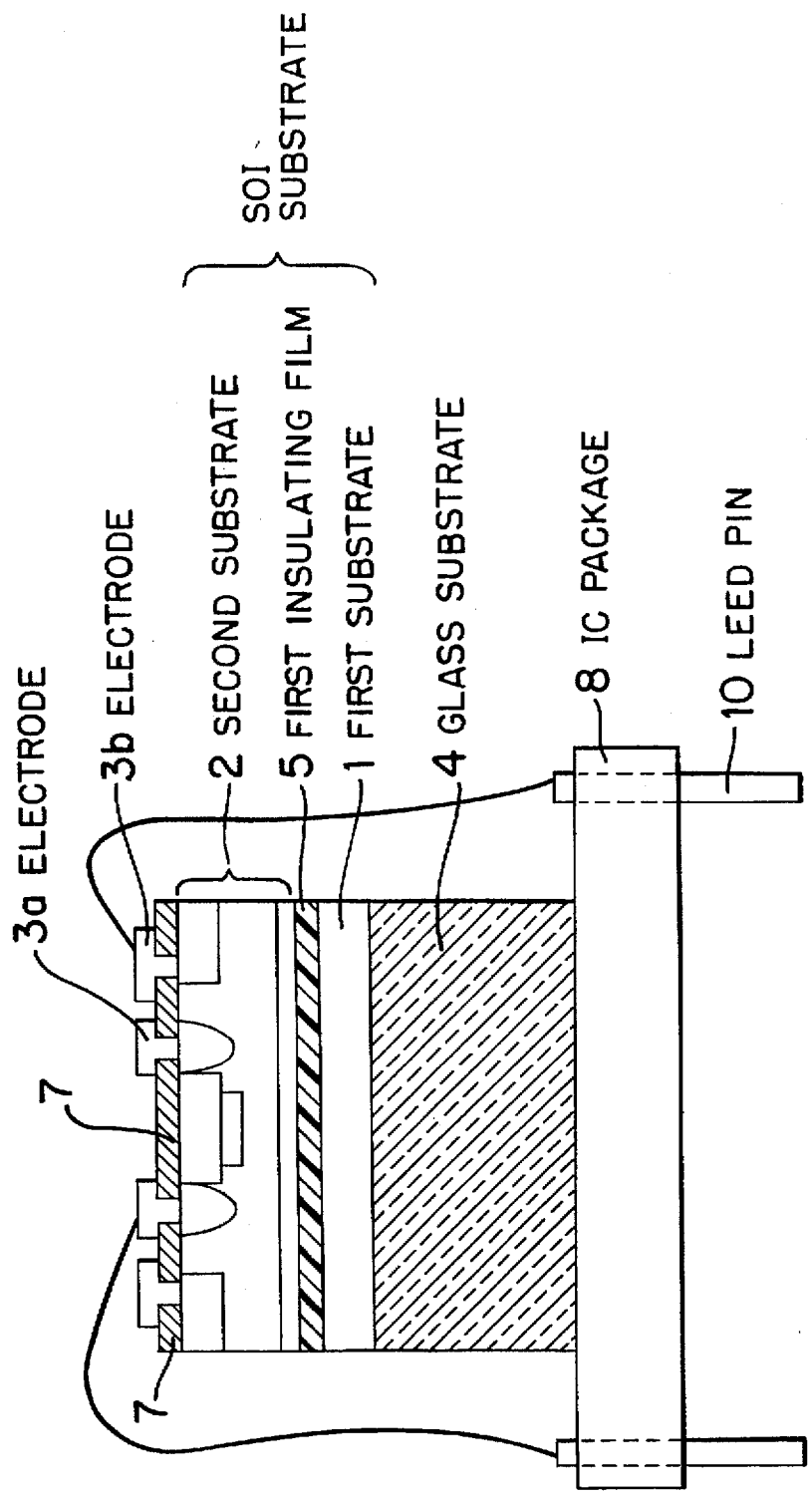
FIG. 5 is a schematic sectional view showing the avalanche photodiode according to one embodiment of the present invention.

FIG. 5 is a sectional view of the avalanche photodiode according to one embodiment of the present invention. In this embodiment, the substrate 1 having no avalanche photodiode formed thereon and the glass substrate 4 are joined to further improve the mechanical strength of the FZ substrate 2 which is joined with the substrate 1. In joining the substrate 1 with the glass substrate 4, a voltage of 200 to 400 V is applied while heating both substrates at 400° to 500° C. for joining the substrates by the anodic bonding process. When the anodic bonding process is used like the present case, no adhesive layer exists so that no degassing need be performed and the measurement can be made even in vacuum. As other kinds of the junction method, the junction using the low melting point glass can be made possible.

Figure 6:
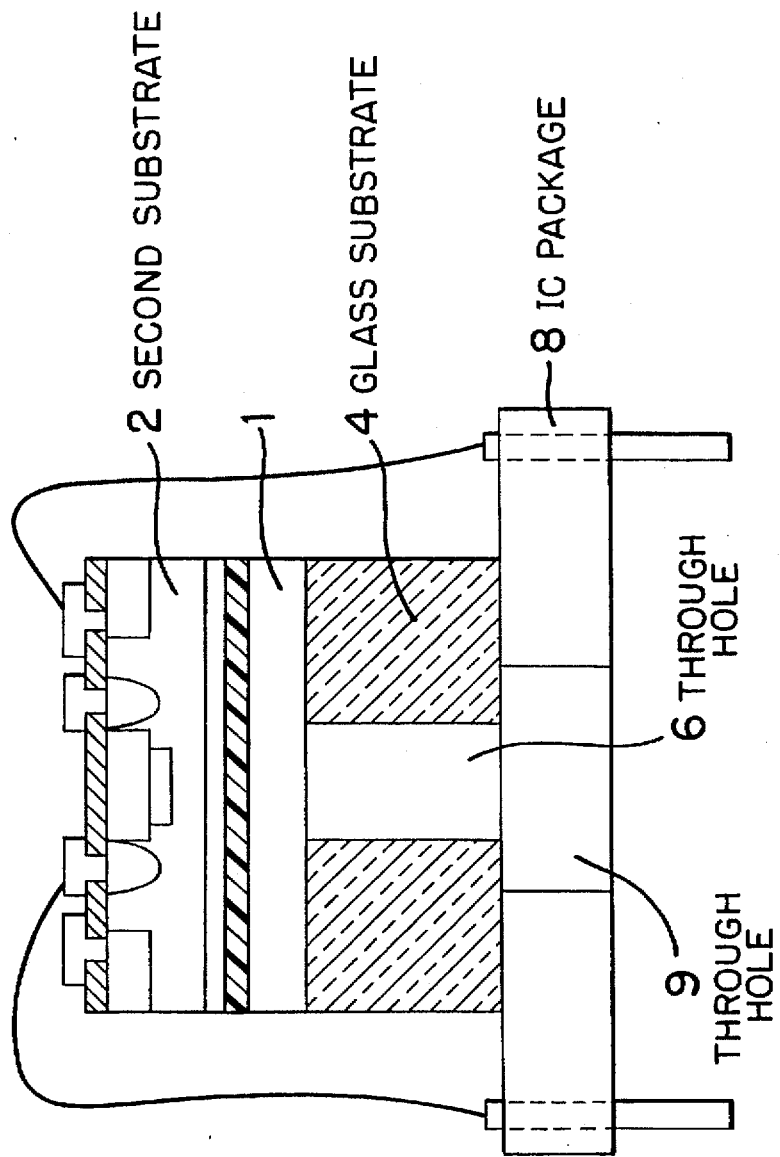
FIG. 6 is a schematic sectional view showing the avalanche photodiode according to one embodiment of the present invention.

FIG. 6 is a sectional view of the avalanche photodiode according to one embodiment of the present invention. In this embodiment, through holes 6 and 9 are formed in one part of a glass substrate 4, which is positioned at a linear relation with the PN junction formed in the FZ substrate 2, and in one part of the IC package 8. These through holes 6 and 9 are required when X-rays or the like are to be detected. In the structure in which no through hole is formed as shown in FIG. 5, no problems arise with general light. However, when the X-ray is to be detected, problem arises. After the X-ray incident from the FZ substrate 2 passes through the substrate 1, the X-ray collides with the glass substrate 4 and is scattered to return to the substrate 1 again. That is detected as a noise. Further, by forming a through hole as shown in FIG. 6, light can be incident from the side of the IC package.

Figure 7:
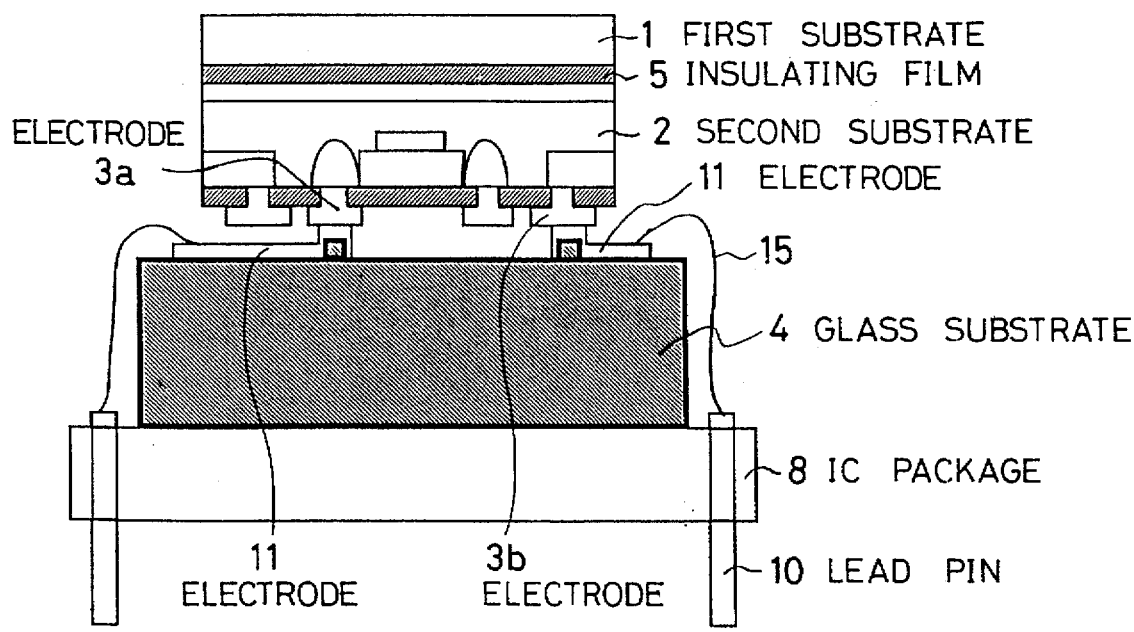
FIG. 7 is a schematic sectional view showing the avalanche photodiode according to one embodiment of the present invention.

FIG. 7 is a sectional view of the avalanche photodiode according to one embodiment of the present invention. In this embodiment, the electrodes 3a and 3b for applying a voltage to the PN junction are opposed to and connected to the electrode 11 formed on the glass substrate 4 for electric conduction. Therefore, the electrode 11 on the glass substrate 4 is connected to a lead pin 10 of the IC package 8 so that a voltage can be applied to the PN junction by applying a voltage to the lead pin.

Figure 8:
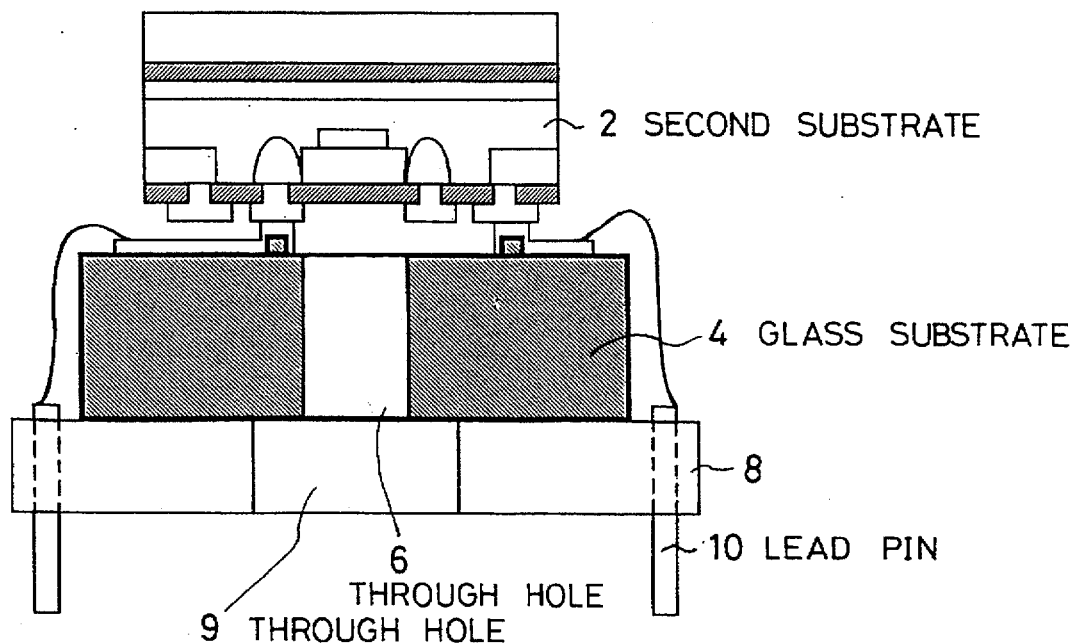
FIG. 8 is a schematic sectional view showing the avalanche photodiode according to one embodiment of the present invention.

FIG. 8 shows the avalanche photodiode according to one embodiment of the present invention wherein through holes 6 and 9 are formed in the glass substrate 4 and the IC package 8 according to the embodiment shown in FIG. 7. The effect of the present invention is that the invention can be used for the detection of the X-ray or the like as described above.

Figure 9:
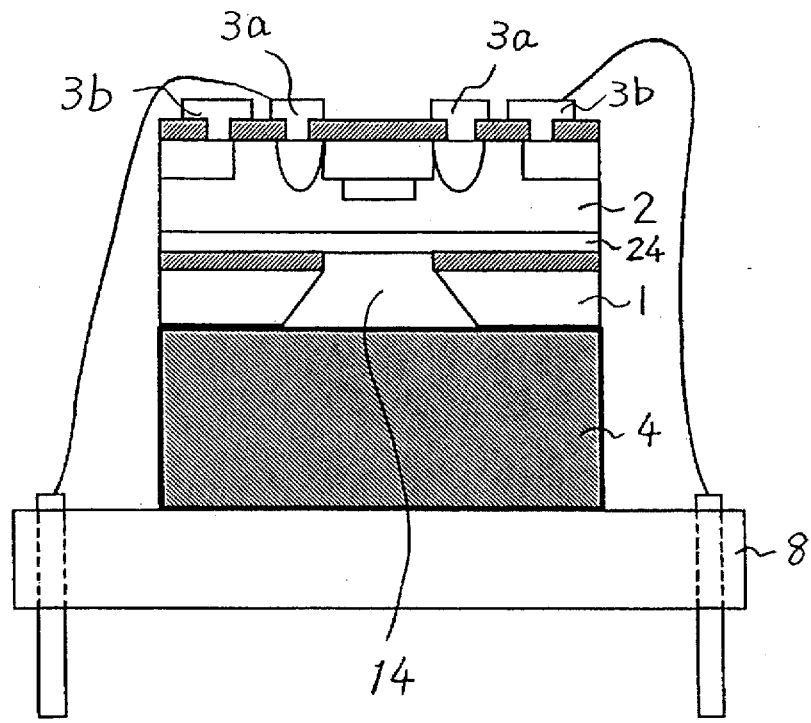
FIG. 9 is a schematic sectional view showing the avalanche photodiode according to one embodiment of the present invention.

FIG. 9 shows the avalanche photodiode according to one embodiment of the present invention wherein the substrate 1 has a structure in which a portion immediately below the PN junction is removed. This means that a blind area is removed for forming only a detection area. In this embodiment, there is shown an example in which such a method for forming a diaphragm is performed with anisotropic etching using an alkaline liquid such as sodium hydroxide solution or the like. With such a structure, the leak current generated by the energy incident on the blind area can be inhibited, thereby an avalanche photodiode having favorable response characteristics can be realized. In this manner, the PN junction is formed within the FZ substrate 2 and the thickness thereof is several tens of μm. Consequently, to reinforce the mechanical strength, the PN junction is joined with the glass substrate 4. Further, even when the PN junction is used under high temperature, the direct influence of heat accumulation on the IC package 8 is avoided. When this structure is adopted in the photodiode, it is necessary to widen electrodes 3a and 3b for applying a voltage to the PN junction even to an area where the substrate 1 remains. This is because there is a high possibility that diaphragm is destroyed when the electrode and the lead pin are connected with wire bonding or the like.

Figure 10:
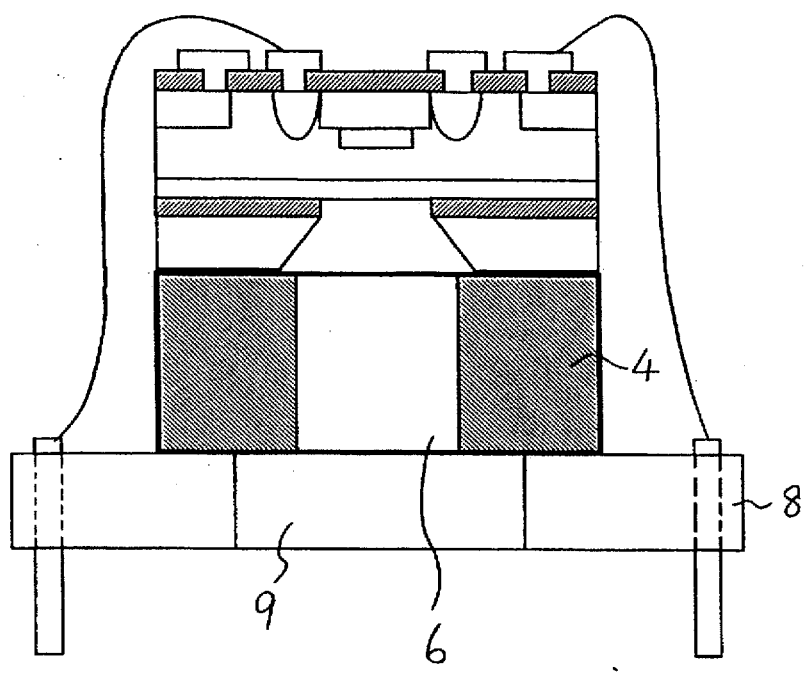
FIG. 10 is a schematic sectional view showing the avalanche photodiode according to one embodiment of the present invention.

FIG. 10 shows an avalanche photodiode according to one embodiment of the present invention wherein through holes 6 and 9 are formed on a glass substrate 4 and an IC package 8 having a structure shown in FIG. 9. This is required when the X-ray or the like is incident on the photodiode. After the X-ray passes through the substrate, the X-ray collides with the glass substrate with the result that the X-ray is scattered and noise is generated. Further, the X-ray can be incident from the side of the IC package 8. Further, it is possible to assume a structure to which an avalanche photodiode is connected.

Figure 11:
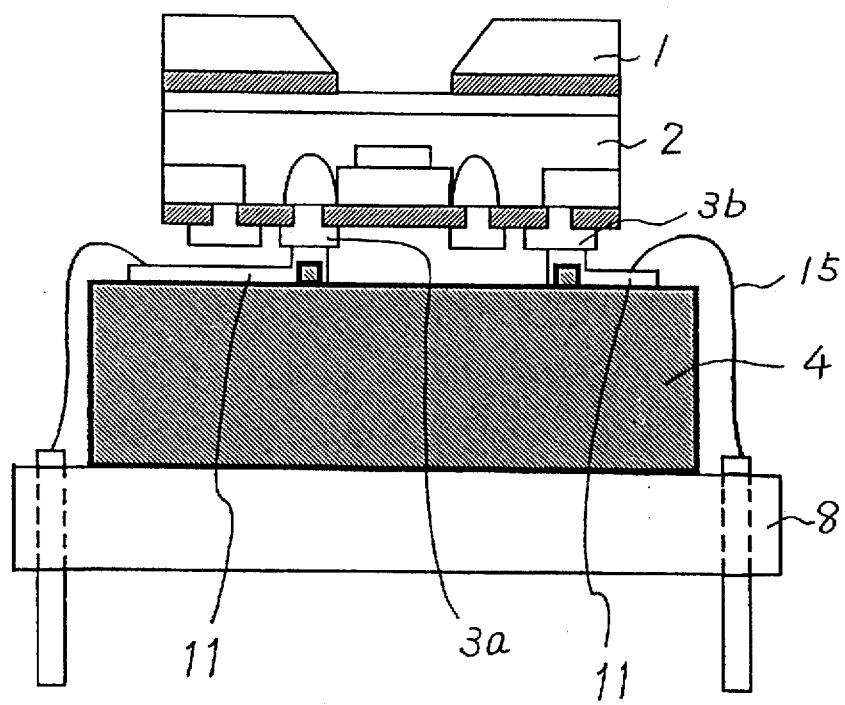
FIG. 11 is a schematic sectional view showing the avalanche photodiode according to one embodiment of the present invention.

FIG. 11 is a schematic sectional view showing the avalanche photodiode according to one embodiment of the present invention. This type of photodiode takes an electric conduction by contacting electrodes 3a and 3b for applying a voltage to the PN junction formed in the FZ substrate 2 with the electrode 11 formed on the side of the glass substrate 4. The FZ substrate 2 and the glass substrate 4 are joined to each other by the anodic bonding process, a process using the low melting point glass, and the like. Further, the glass substrate 4 which is joined with the substrate 1 is joined with the IC package 8. The glass substrate 4 is joined with the substrate 1 by using an eutectic junction, a low melting point glass or a ceramic adhesive requiring no degassing. An electric connection is made to provide an electric conduction by connecting an electrode 11 on the glass substrate side and the lead pin 10 of the IC package 8 with a metal wire 15. By adopting such a structure, a light signal can be incident from the substrate 1. When light is incident from this direction, the depth of the infiltration of the radiant rays or the like to the substrate becomes distant from the layer which constitutes an amplification area so that the amplification rate is never distributed and lowered.

Figure 12:
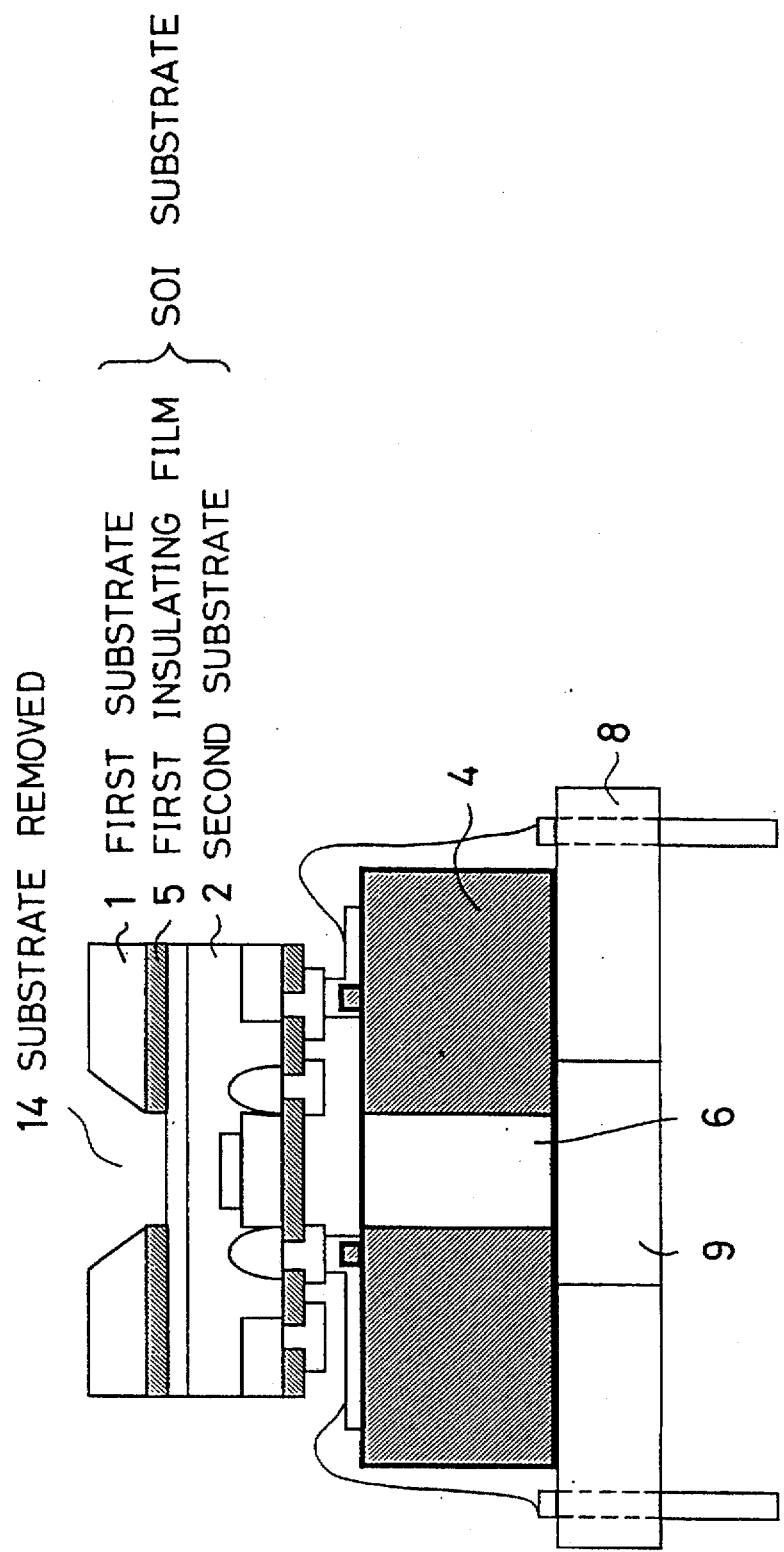
FIG. 12 is a schematic sectional view showing the avalanche photodiode according to one embodiment of the present invention.

FIG. 12 is a schematic sectional view showing the avalanche photodiode according to one embodiment of the present invention. In the embodiment, in addition to the structure described in FIG. 11, through holes 6 and 9 are formed on the glass substrate 4 and the IC package 8, respectively. This is required for allowing the X-ray or the like to be incident on the photodiode. The X-ray collides with the glass substrate and is scattered after passing through the glass substrate so that noise is generated. Further, the X-ray can be incident from the side of the IC package 8. Furthermore, it is possible to assume a structure for connecting the avalanche photodiode.

Figure 13:
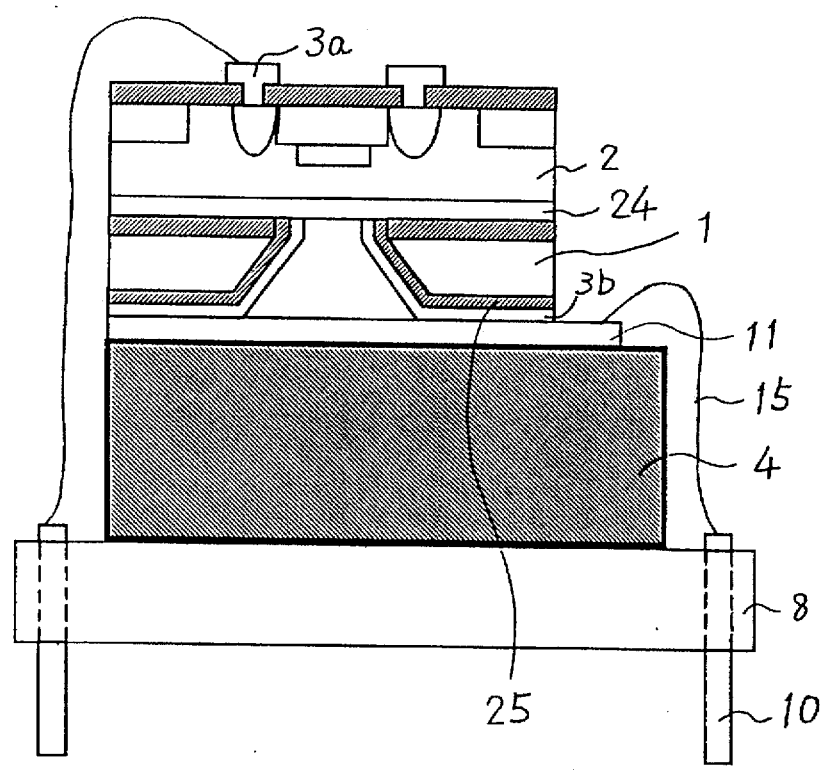
FIG. 13 is a schematic sectional view showing the avalanche photodiode according to one embodiment of the present invention.

FIG. 13 is a schematic sectional view showing the avalanche photodiode according to one embodiment of the present invention. This embodiment is an example in which an avalanche photodiode shown FIG. 3 is packaged. The substrate 1 is joined with the glass substrate 4 and at the same time, the electrode 3b contacts the electrode 11 on the glass substrate 4 to provide an electric conduction. The electrode 3b is formed so as to contact the $P^+$-type layer 24 on the side of substrate 1 of the FZ substrate 2. Further, between the electrode 3b and the substrate 1, for example, an insulating film 25 comprising an oxide film is formed. Consequently, the electrode 3a and the electrode 11 are connected to the lead pin 10 of the IC package 8, respectively, with a metal wire 15, or the like, with the result that voltage is applied to the PN junction if voltage is applied to the lead pin 10.

Figure 14:
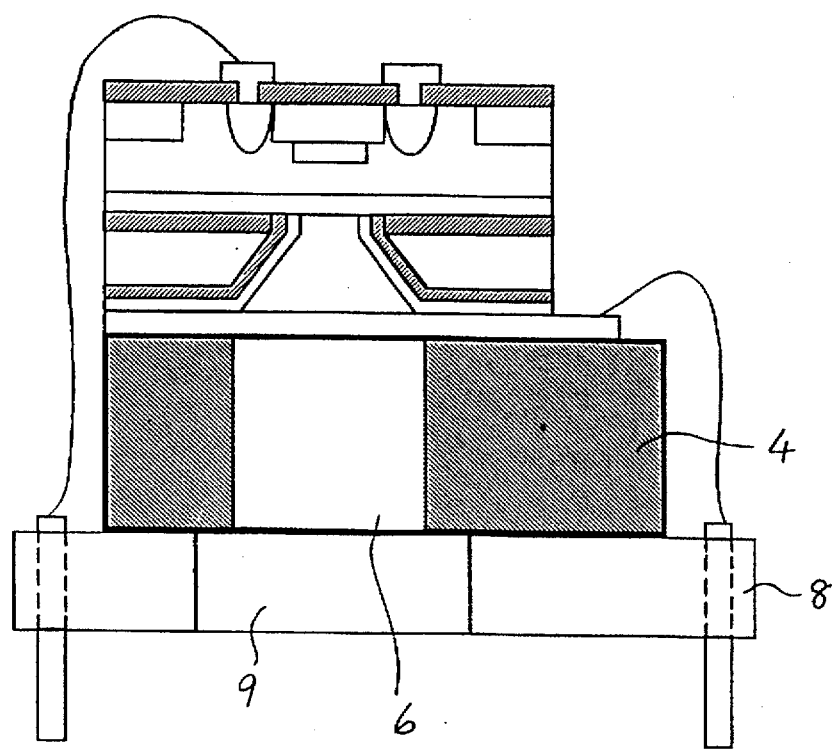
FIG. 14 is a schematic sectional view showing the avalanche photodiode according to one embodiment of the present invention.

FIG. 14 is a schematic sectional view showing the avalanche photodiode according to one embodiment of the present invention. In this embodiment, in addition to the structure of the avalanche photodiode shown in FIG. 13, through holes 6 and 9 are formed in the glass substrate 4 and the IC package 8 respectively. This is required when the X-ray or the like is incident on the photodiode. After the X-ray passes through the substrate, the X-ray collides with the glass substrate 4 and is scattered with the result that noise is generated. Further, radiation from the side of the IC package 8 can also be incident. Furthermore, it is also possible to assume a structure for connecting the avalanche photodiode.

Figure 15:
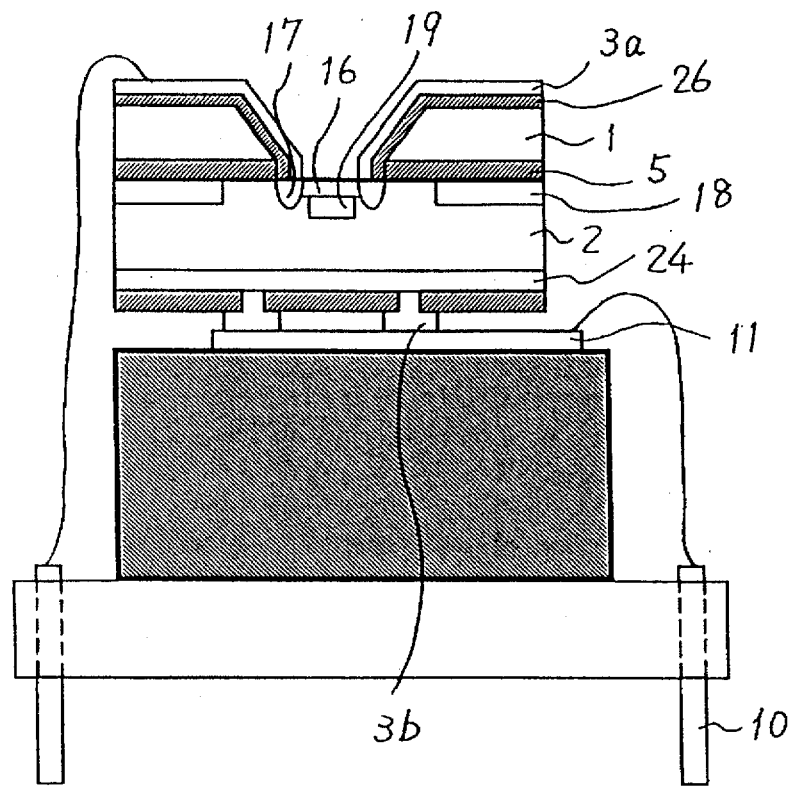
FIG. 15 is a schematic sectional view showing the avalanche photodiode according to one embodiment of the present invention.

FIG. 15 shows the avalanche photodiode according to one embodiment of the present invention. The embodiment is an example in which the avalanche photodiode shown in FIG. 4 is packaged. Voltage is applied from the lead pin 10 to the PN junction by connecting the electrodes 3a and 3b thereto. In this structure, the mechanical strength is reinforced since the joint area between the FZ substrate 2 and the glass substrate 4 increases.

Figure 16:
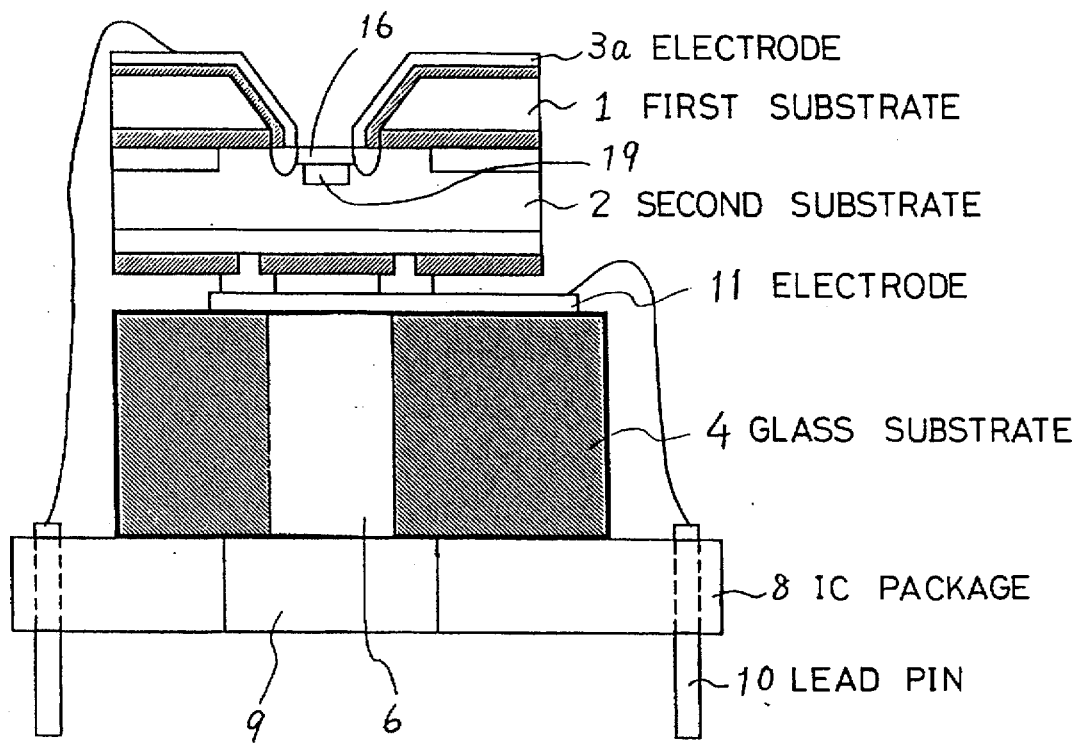
FIG. 16 is a schematic sectional view showing the avalanche photodiode according to one embodiment of the present invention.

FIG. 16 shows the avalanche photodiode according to one embodiment of the present invention. In the glass substrate 4 and the IC package 8 shown in FIG. 15, through holes 6 and 9 are formed. The through holes 6 and 9 are required when the X-ray or the like is incident on the photodiode. After the X-ray passes through the glass substrate 4, the X-ray collides with the glass substrate 4 and is scattered with the result that noise is generated. Further, radiation from the side of the IC package 8 can also be incident. And furthermore it is possible to assume a structure for connecting the avalanche photodiodes.

Figure 17:
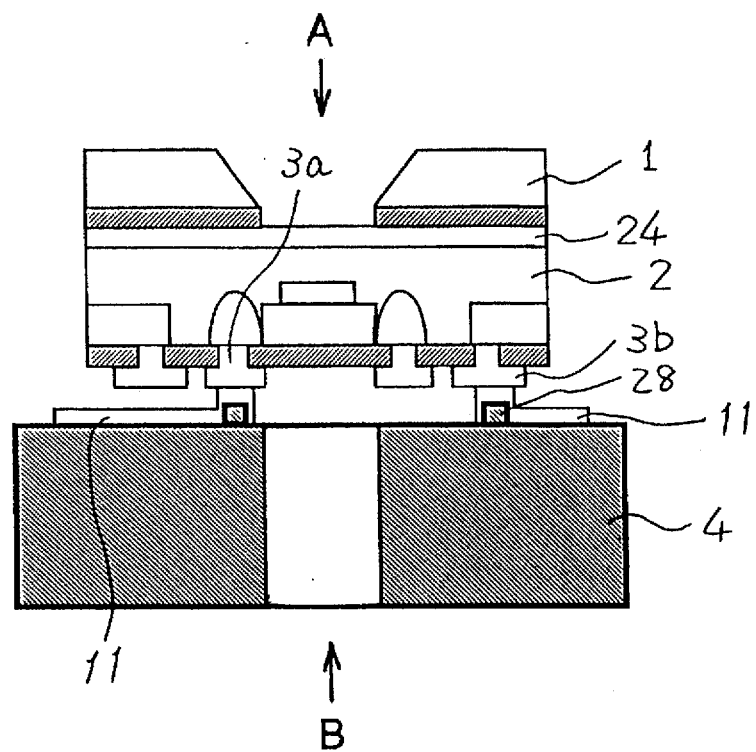
FIG. 17 is a schematic sectional view showing the avalanche photodiode according to one embodiment of the present invention, the view showing the embodiment before being packaged in an IC package.

FIG. 17 is a schematic sectional view showing the avalanche photodiode according to one embodiment of the present invention. FIG. 17 shows a state before the avalanche photodiode is packaged in the IC package, the view showing a state in the avalanche photodiode is joined with the glass substrate 4. Electrodes 3a and 3b for applying a voltage to the PN junction formed in the FZ substrate 2 contact electrodes 11 on the glass substrate 4. Further, on the glass substrate, projection 28 is formed in order to provide good electric contact, so that electrode 11 is formed on the projection 28.

Figure 18:
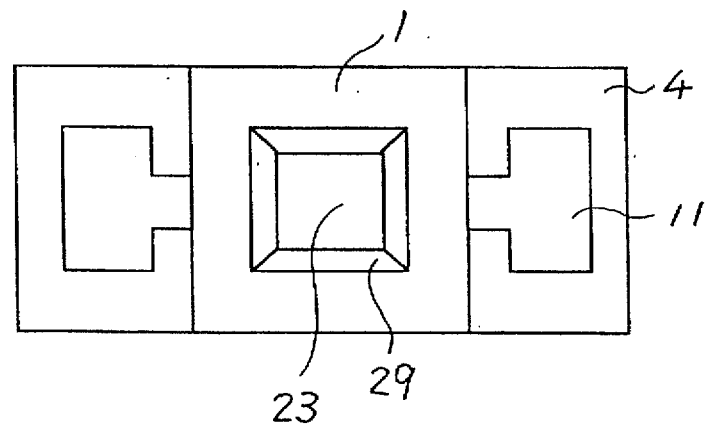
FIG. 18 is a schematic top view seen from the direction of A of FIG. 17, the view showing the avalanche photodiode according to one embodiment of the present invention.

FIG. 18 is a schematic top view obtained when FIG. 17 is seen from the direction A, the view showing the avalanche photodiode according to one embodiment of the present invention. When the substrate 1 having surface direction (100) is subjected to anisotropic etching, (111) surface 29 appears. The silicon surface 23 is the surface of the $P^+$-type layer 24 formed on the FZ substrate 2 as shown in FIG. 17. Further, on the glass substrate 4, an electrode 11 is formed.

Figure 19:
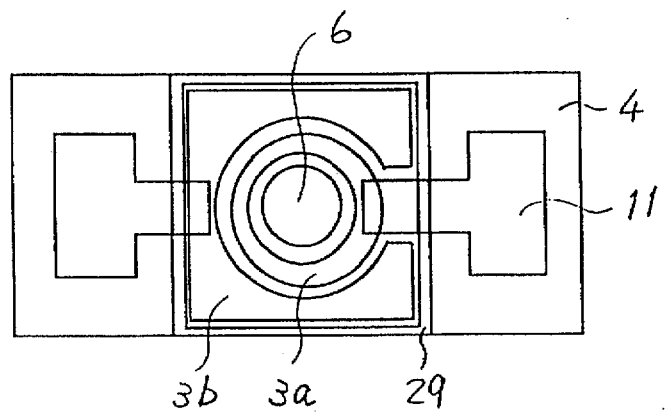
FIG. 19 is a schematic top view seen from the direction of B of FIG. 17, the view showing the avalanche photodiode according to one embodiment of the present invention.
Figure 20:
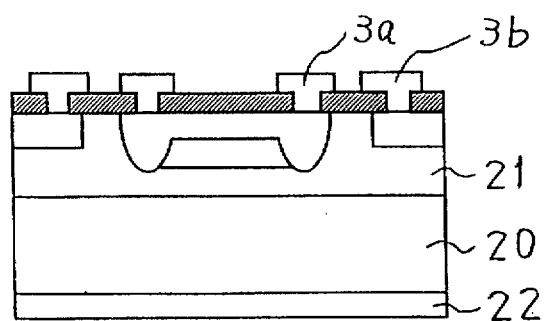
FIG. 20 is a schematic sectional view showing a conventional avalanche photodiode.
Figure 21:
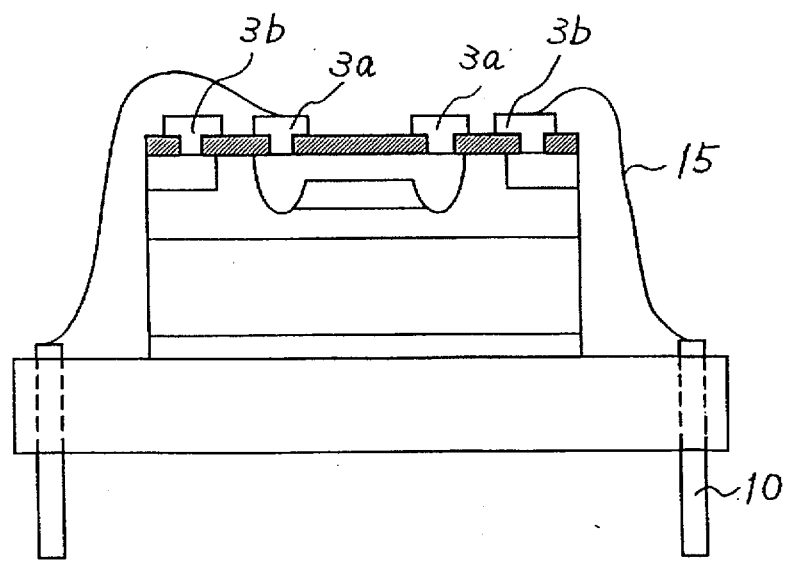
FIG. 21 is a schematic sectional view showing the conventional avalanche photodiode.
Figure 22:
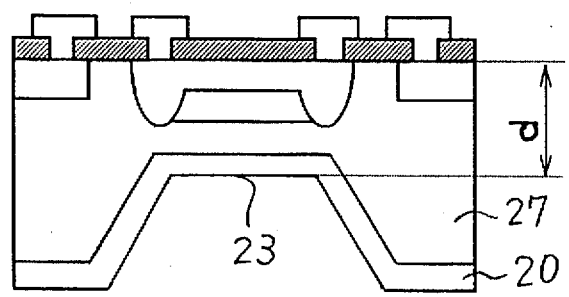
FIG. 22 is a schematic sectional view showing the conventional avalanche photodiode.
Figure 23:
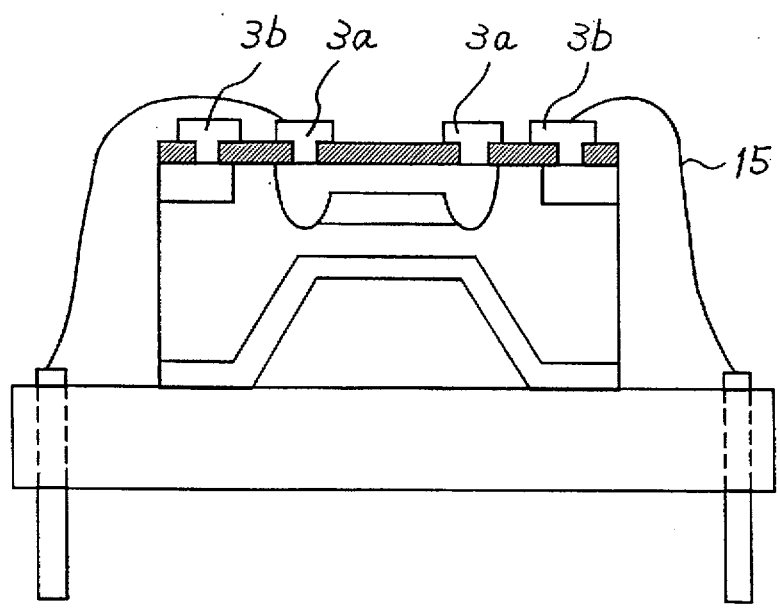
FIG. 23 is a schematic sectional view showing the conventional avalanche photodiode.

FIG. 19 is a schematic top view obtained when FIG. 17 is seen from the direction B, the view showing the avalanche photodiode according to one embodiment of the present invention. The electrode 11 on the glass substrate 4 contacts electrodes 3a and 3b for applying a voltage to the PN junction. Consequently, the embodiment functions as an avalanche photodiode by applying a voltage to the electrodes on the glass substrate. Further, in the glass substrate 4, a through hole 6 is formed thereby preventing the X-ray from colliding with the glass substrate 4.

FIGS. 24A through 25D illustrate a method for fabricating the avalanche photodiode according to the present invention.

FIGS. 24A–24E are views showing a method for converting the avalanche photodiode shown in FIG. 1 into an avalanche photodiode (photodiode which is thinned having a sensing part thinned down by anisotropic etching) shown in FIG. 2. Out of the above-mentioned drawings, FIGS. 24A through 24E show a step for fabricating a glass cover 110a for protecting the surface which is not etched from an etching solution.

Figure 24A:
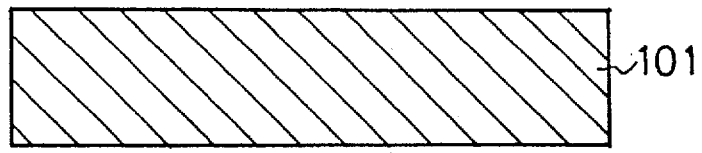
FIGS. 24A–24E are sectional view showing a method for fabricating the avalanche photodiode according to the present invention.

FIG. 24A shows a glass substrate 101 before processing.

Figure 24B:
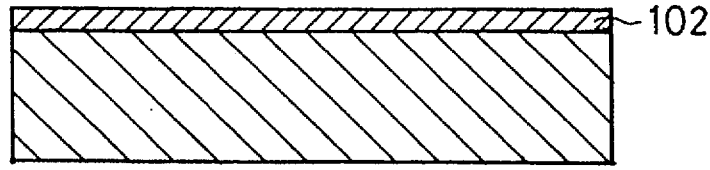

FIG. 24B shows a state in which a metal thin film 102 is formed on the glass substrate 101.

Figure 24C:
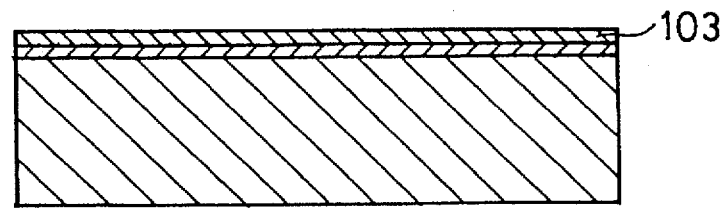
Figure 24D:
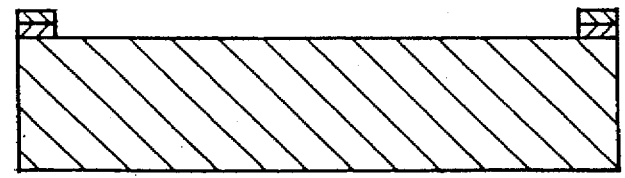

FIG. 24C shows a state in which a photoresist 103 is formed on the metal thin film 102. FIG. 24D shows a state in which the photoresist 103 on the metal thin film 102 and the metal thin film 102 are patterned by the photolithography technology.

Figure 24E:
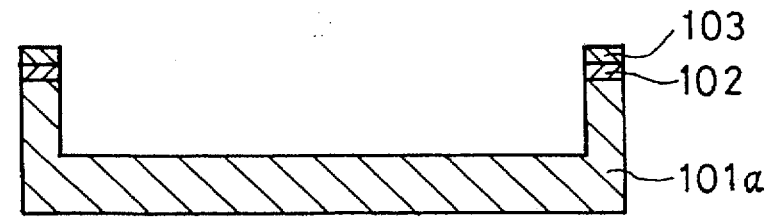

FIG. 24E shows a step of etching the glass substrate 4 with fluoric acid agent by using the metal thin film 102 and the photoresist 103 obtained in the previous process as a mask. Further, although not shown in the drawings, the photoresist 103 and the metal thin film 102 are removed by etching to obtain s glass cover 110a having projections.

Figure 25A:
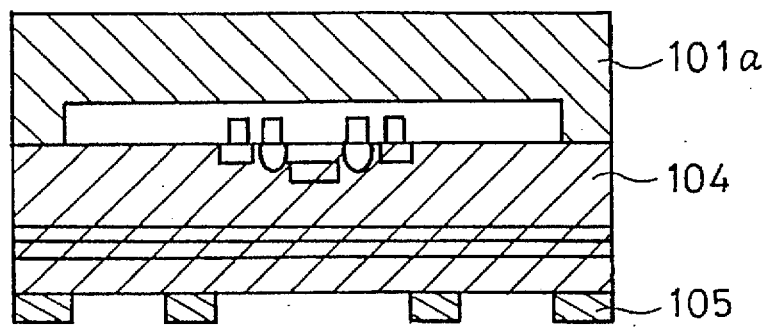
FIGS. 25A–25D are sectional view showing a method for fabricating the avalanche photodiode according to the present invention.

FIG. 25A shows a state in which the glass cover 101a which is formed previous step FIG. 24E and the avalanche photodiode element 104 are laminated to each other. A method for laminating the glass cover 101a with the avalanche photodiode element 104 includes the anodic bonding process and the method using the low melting point glass, the eutectic junction process, and the like. This step is for protecting the surface of the avalanche photodiode element from the agent used for etching the silicon substrate 106 at the following step FIG. 25B.

Figure 25B:
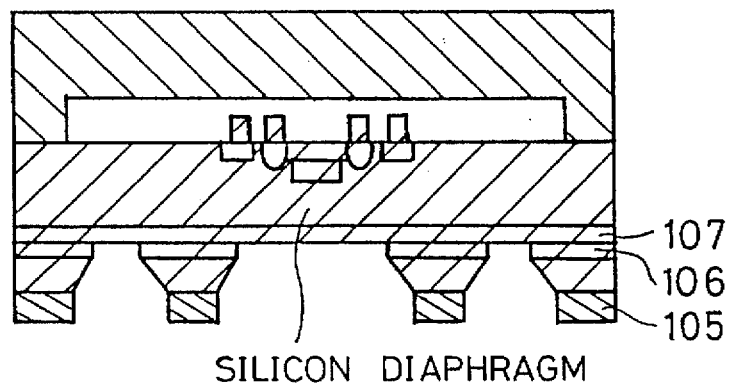

There is shown at step FIG. 25B that the silicon nitride film 105 is used as a mask to subject the silicon substrate 106 to the anisotropic etching with an alkali agent such as potassium hydroxide or the like. It is also possible to subject the silicon substrate 106 to the isotropic etching with fluoric acid agent or the like. In the etching of the silicon substrate 106, the etching process is suspended at a silicon oxide 107 in the SOI substrate (a substrate in a structure in which the silicon semiconductor substrate is laminated by sandwiching an insulating film which is described as the first means for solving the problem) which forms an avalanche photodiode element 104. Here, the silicon substrate 106 is taken out of the agent to be cleaned. FIG. 25B shows a state in which the silicon oxide film is etched and removed with fluoric acid agent after that.

Figure 25C:
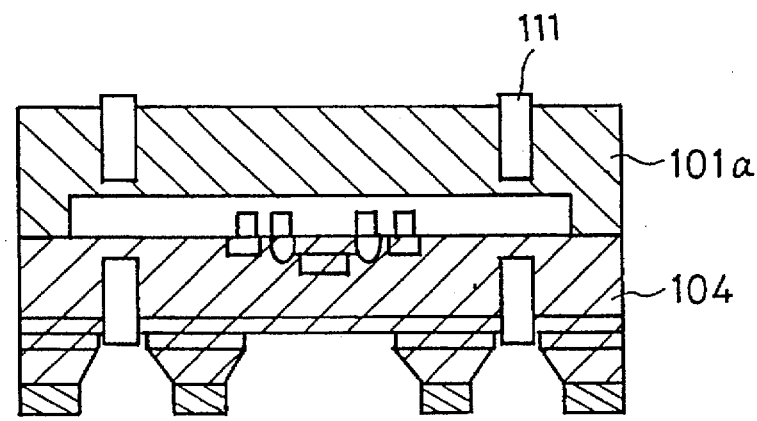
Figure 25D:
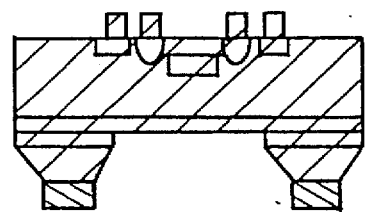

FIG. 25C shows a state in which the silicon substrate has been diced from the glass cover 101a and the avalanche photodiode element 104. At this time, when the glass cover 101a and the avalanche photodiode element 104 are diced at the same time, cooling water at the time of dicing may trap the dicing powders which adhere to the surface of the avalanche photo diode diode element 104 and cannot be removed. Consequently, the dicing is suspended at the depth shown with the dicing line 111 shown in FIG. 25C so that both the silicon substrate and the glass cover 101a are not completely diced off. FIG. 25D shows a state in which the substrate is bent along the dicing line 111 used at step shown in FIG. 25C so that the avalanche photodiode element 104 is completed by removing the glass substrate 4 on the surface and separating the glass substrate 4 on the surface from the wafer of the avalanche photodiode element 104.

FIGS. 26A–26F shows a method for fabricating a glass substrate used in an embodiment shown in FIG. 7 or the like. The step is intended to join an avalanche photodiode element 104 with a glass substrate 4 on which an electrode is formed to obtain a function as an avalanche photodiode by applying a reverse bias to the electrode on the glass substrate side.

Figure 26A:
FIGS. 26A–26F are sectional view showing a method for fabricating the avalanche photodiode according to the present invention.

FIG. 26A shows a glass substrate 4 before processing.

Figure 26B:
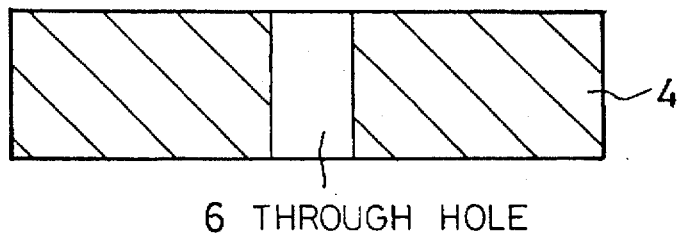

FIG. 26B shows a state in which a through hole 6 is formed in the glass substrate by ultrasonic wave or the like. This through hole 6 is formed for preventing X-ray or the like from being reflected by the glass substrate when the X-ray or the like are incident on the avalanche photodiode element.

Figure 26C:
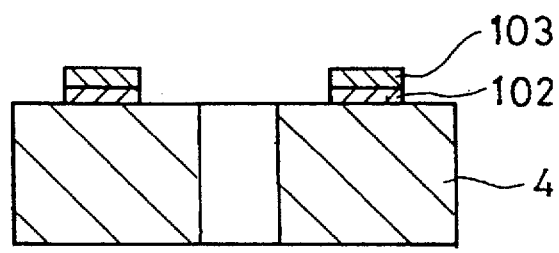

FIG. 26C shows a state in which the metal thin film 102 and the photoresist 103 are formed on the glass substrate 4 and patterned for etch processing the glass substrate 4.

Figure 26D:
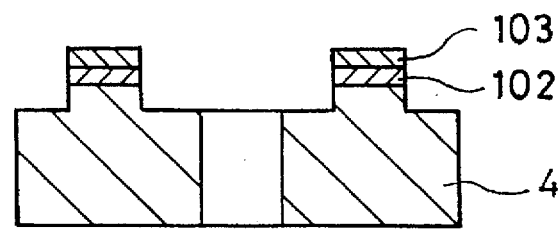

FIG. 26D shows a state in which the glass substrate 4 is etched in accordance with the metal thin film 102 and the photoresist 103 which are formed at the step shown in FIG. 26C.

Figure 26E:
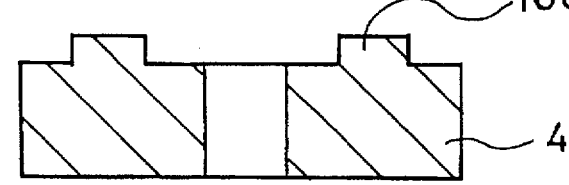

FIG. 26E shows a state after the glass substrate has been etched. In FIG. 26E, projection 108 is a part which is joined with the avalanche photodiode element at the following step.

Figure 26F:
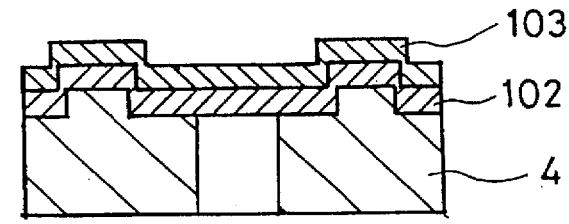

FIG. 26F shows a state in which a metal thin film 102 and the photoresist 103 are formed on the glass substrate 4 for the second glass etching.

Figure 27A:
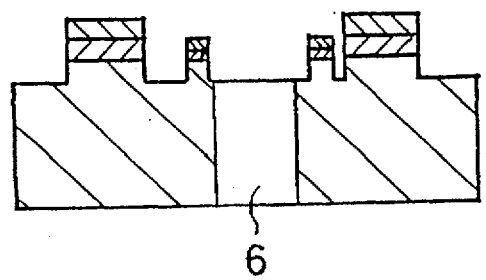
FIGS. 27A–27E are sectional view showing a method for fabricating the avalanche photodiode according to the present invention.

FIG. 27A shows a state in which the metal thin film 102 and the photoresist 103 which are formed at the preceding step are patterned.

Figure 27B:
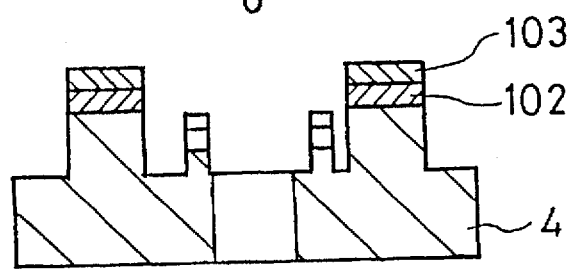

FIG. 27B shows a state in which the glass substrate is etched in accordance with the metal thin film 102 and the photoresist 103 formed at the step shown in FIG. 27A.

Figure 27C:
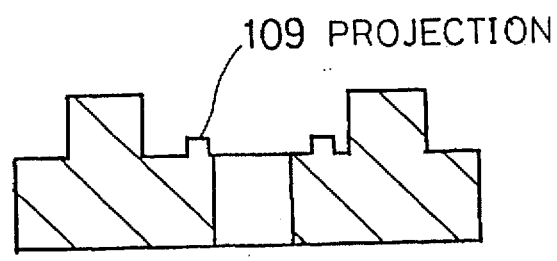

FIG. 27C shows a state after the etching of the glass substrate. The projection 109 formed at this step is a portion where an electrical connection is formed in contact with the avalanche photodiode element at the following step.

Figure 27D:
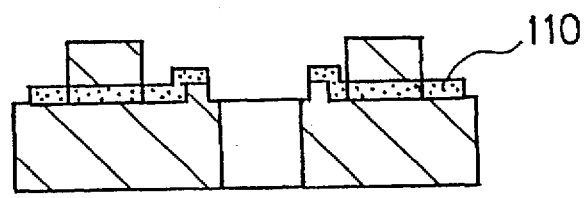

FIG. 27D is a state in which the metal thin film 102 formed of aluminum or the like is formed and patterned, which constitutes an electrode material on the glass side.

Figure 27E:
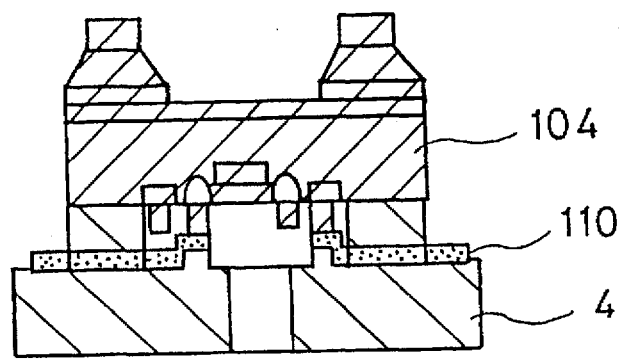

FIG. 27E shows a state in which the glass substrate and the avalanche photodiode which have been completed up to the step shown in FIG. 27D are joined. The joining method includes the anodic bonding process and the method using the low melting glass or like.

As described above, an avalanche photodiode according to the present invention is provided on a FZ-SOI substrate and part of the substrate 1 is removed to expose the FZ substrate so that a shallow depletion layer is formed on the surface thereof. Consequently, an avalanche photodiode can be formed which has a very high sensitivity and a high time resolution. Further, these avalanche photodiode element which can is joined with glass substrate can be packaged in various ways. Therefore, the effect of the present invention is that the mechanical strength can be increased so that the warp and the deformation of the substrate can be prevented. The avalanche photodiode of the present invention can be used even in vaccum because of the absence of degassing when the substrate and the glass substrate are joined by anodic bonding process or the method using the low melting point glass. Further, by forming the through hole in the glass substrate and the IC package, not only the light detection, but also the x-rays or the like can be detected.

What is claimed is:

1. An avalanche photodiode comprising: a first substrate; a first insulating film formed on the first substrate; a second substrate comprising a floating zone silicon semiconductor substrate which is crystal grown on the first insulating film; a second insulating film formed on the second substrate; a PN-junction formed in the second substrate; and a plurality of electrodes for applying a voltage to the PN-junction formed on the second substrate; wherein the first substrate is mounted to a first surface of a glass substrate, a second surface of the glass substrate is mounted to an integrated circuit package, and the plurality of electrodes are electrically connected with one or more lead pins of the integrated circuit package.

2. An avalanche photodiode according to claim 1; wherein a portion of the first substrate is removed at least partially at a location in linear alignment with the PN-junction formed in the second substrate so as to increase the sensitivity of the PN-junction to incident radiation.

3. An avalanche photodiode according to claim 2; wherein the first substrate comprises a silicon semiconductor substrate having a (100) surface direction.

4. An avalanche photodiode according to claim 2; wherein the PN-junction comprises a portion of the second substrate as a first region having a first conductivity type, a second region comprising an impurity region having a second conductivity type formed in the second substrate, and a third region comprising an impurity region having a first conductivity type formed in the second substrate adjacent to the second region and having a higher impurity concentration than another portion of the second substrate.

5. An avalanche photodiode comprising: a first substrate; a first insulating film formed on the first substrate; a second substrate comprising a floating zone silicon semiconductor substrate that is crystal grown on the first insulating film; a PN-junction formed in the second substrate; a second insulating film formed on the second substrate; and a plurality of first electrodes for applying a voltage to the PN-junction formed on a surface of the second substrate so as to sandwich the second insulating film; wherein a surface of the second substrate on which the plurality of electrodes are formed is joined with a first surface of a glass substrate on which one or more second electrodes are formed, a surface of the glass substrate opposite to the surface where the second electrode is formed is joined with an integrated circuit package, and the one or more second electrodes formed on the glass substrate are electrically connected to one or more lead pins of the integrated circuit package.

6. An avalanche photodiode according to claim 1 or 5; wherein a first through hole is formed in a portion of the glass substrate in linear alignment with a portion of the second substrate where the PN-junction is formed, and a second through hole is formed in the integrated circuit package in linear alignment with the first through hole.

7. An avalanche photodiode according to claim 6; wherein the first substrate is removed at least in one part immediately below the PN-junction in said second substrate.

8. An avalanche photodiode comprising: a semiconductor substrate having a floating zone silicon semiconductor layer and a supporting substrate layer; a PN junction formed in the floating zone silicon layer; and a plurality of electrodes formed on the semiconductor substrate for applying a voltage to the PN junction.

9. An avalanche photodiode according to claim 8; further comprising a glass substrate having a first surface mounted to the semiconductor substrate; and an integrated circuit package mounted to a second surface of the glass substrate and having one or more lead terminals connected to the plurality of electrodes.

10. An avalanche photodiode according to claim 9; further comprising a first insulating film formed between the supporting substrate layer and the floating zone silicon semiconductor layer, and a second insulating film formed on the floating zone silicon semiconductor layer.

11. An avalanche photodiode according to claim 10; wherein the supporting ace direction.

12. An avalanche photodiode according to claim 10; further comprising a π-layer formed between the first insulating film and the second substrate.

13. An avalanche photodiode according to claim 10; wherein the supporting substrate layer has a first conductivity type and the floating zone silicon semiconductor layer has a second conductivity type.

14. An avalanche photodiode according to claim 9; wherein one or more of the electrodes are formed on a first surface of the semiconductor substrate and one or more other electrodes are formed on a second surface of the semiconductor substrate.

15. An avalanche photodiode according to claim 8; further comprising a glass substrate anodically bonded to the semiconductor substrate.

16. An avalanche photodiode according to claim 15; further comprising an integrated circuit package having one or more lead terminals, and a plurality of contacts mounted to a first surface of the glass substrate and connected to the one or more lead terminals of the integrated circuit package; wherein the plurality of electrodes are electrically connected to the contacts.

17. An avalanche photodiode according to claim 16; wherein at least a portion of the semiconductor substrate is removed below the PN junction.

18. An avalanche photodiode according to claim 17; wherein a first through hole is provided in the glass substrate in linear alignment with the portion of the substrate that is removed.

19. An avalanche photodiode according to claim 18; wherein a second through hole is provided in the integrated circuit package in linear alignment with the first through hole.

20. An avalanche photodiode comprising: a first substrate having a portion removed therefrom; a first insulating film formed on the first substrate; a second substrate comprising a floating zone silicon semiconductor substrate disposed on the first insulating film; an impurity region selectively formed in the second substrate at a surface corresponding to the removed portion of the first substrate; a PN junction formed in the second substrate; a glass substrate mounted to the second substrate; a first electrode formed on the first substrate for applying a voltage to the impurity region; a second electrode formed on the second substrate for applying a voltage to the second substrate; a third electrode formed on the glass substrate and electrically connected to the second electrode; and an integrated circuit package having a lead pin connected to the third electrode.

21. An avalanche photodiode comprising: a first substrate having a portion removed therefrom; a first insulating film formed on the first substrate; a second substrate comprising a crystal grown floating zone silicon semiconductor substrate; a PN junction formed in the second substrate; a glass substrate mounted to the second substrate; first and second electrodes formed on the second substrate for applying a voltage across the PN junction; a third electrode formed on the glass substrate and being electrically connected to the second electrode; and an integrated circuit package having a plurality of lead pins electrically connected to the first and third electrodes.

\* \* \* \* \*